US005621240A

United States Patent [19]

Ellis

[11] Patent Number: 5,621,240

[45] Date of Patent: Apr. 15, 1997

[54] SEGMENTED THICK FILM RESISTORS

[75] Inventor: Marion E. Ellis, Kokomo, Ind.

[73] Assignee: Delco Electronics Corp., Kokomo, Ind.

[21] Appl. No.: 523,580

[22] Filed: Sep. 5, 1995

[51] Int. Cl.[6] .................... H01L 27/04

[52] U.S. Cl. .................... 257/536; 257/537; 257/379; 257/904

[58] Field of Search .................... 257/536, 537, 257/538, 379, 380, 381, 382, 383, 384, 385, 904

[56] References Cited

U.S. PATENT DOCUMENTS

| | | | |
|---|---|---|---|
| 3,593,069 | 7/1971 | Madden | 257/536 |
| 3,665,346 | 5/1972 | Orr | 333/70 CR |
| 4,215,333 | 7/1980 | Huang | 338/322 |
| 5,500,553 | 3/1996 | Ikegami | 257/538 |

FOREIGN PATENT DOCUMENTS

| | | | |
|---|---|---|---|
| 0117358 | 5/1987 | Japan | 257/536 |

OTHER PUBLICATIONS

Wiedmann, S.K., "Monolithic Resistor Structure", IBM Technical Disclosure Bulletin, vol. 13, No. 5, Oct. 1970, p. 1316.

*Primary Examiner*—Sara W. Crane
*Assistant Examiner*—David Hardy
*Attorney, Agent, or Firm*—Mark A. Navarre

[57] ABSTRACT

A novel thick film resistor configuration and a method for fabricating thick film resistors, by which such resistors can be processed to achieve targeted electrical properties in an as-fired condition. The configuration and method of this invention involve creating a thick film resistor in the form of a series of short resistors whose combined resistance values approximately equal the predetermined resistance value required of the thick film resistor by its hybrid electronic circuit, yet with the use of minimal post-firing trimming. Such a configuration and method enable the production of thick film resistors from the same ink composition but with significantly different aspect ratios, yet which exhibit minimal differences between TCR values. Consequently, thick film resistors configured and fabricated in accordance with this invention are characterized by enhanced production throughput, repeatability, and reliability.

5 Claims, 4 Drawing Sheets

SEGMENTED THICK FILM RESISTORS

The present invention generally relates to thick film resistors used in hybrid electronic circuits, and to the processing of such resistors. More particularly, this invention relates to an improved thick film resistor configuration and a processing method for fabricating thick film resistors, by which desired resistance values and balance between resistors within a circuit are more readily achieved in the as-fired condition, even when the resistors have significantly different aspect ratios and sheet resistances, and by which near-constant temperature coefficients of resistance are achieved for resistors formed of the same ink, regardless of physical size.

BACKGROUND OF THE INVENTION

Thick film resistors are employed in hybrid electronic circuits to provide a wide range of resistor values, generally between about 0.1 Ω and about 10 Ω. Such resistors are printed on a ceramic substrate using thick film pastes, or inks, which are conventionally composed of an organic vehicle, a glass frit composition, an electrically conductive material, and various additives used to favorably effect the final electrical properties of the resistor. Theoretically, a single ink composition could be used to create all resistors on a given circuit by forming the resistors to have appropriate lengths. However, space and size constraints typically dictate the use of different inks compositions within a given circuit. For this purpose, inks are commercially available in composition families referred to as end-members, which are formulated to produce resistors having sheet resistivities ($R_S$) in decade values from about 1 ohm per square (Ω/□) to about 10 megohms per square (MΩ/□), (per 25 micrometers of dried thickness). Compositions having values that are one decade apart are referred to as adjacent end-members, which are blended to produce intermediate values of resistance.

After printing, thick film inks are typically dried and then sintered, or fired, to convert the ink into a suitable film that adheres to the ceramic substrate. During sintering, the ink is heated at a rate that is sufficiently slow to promote stability of the resistor and to allow the organic vehicle of the ink to burnoff. Both physical and chemical changes occur within the thick film during sintering, by which the conduction network or microstructure of the resistor are formed. Various additives are typically used to achieve specific desired resistivity, stability and temperature characteristics.

The electrical resistance of a thick film resistor will vary with temperature, and may be permanently altered when subjected to a hostile environment. A thick film resistor's sensitivity to temperature is indicated by its temperature coefficient of resistance (TCR), as measured in parts per million per degree C. (ppm/°C.). Thick film resistors can typically be calibrated to have a TCR in the range of about ±50 to about ±100 ppm/°C. Calibration to a tighter limit is generally prevented by a significant difference in the values for TCR obtained at −55° C. and 125° C., which are standard temperature extremes used by the industry to evaluate the electrical characteristics of thick film resistors, as well as blending anomalies which occur as a result of interactions between the additives included in the ink to selectively alter the electrical characteristics of the resistor.

The resistance of a thick film resistor can be theoretically determined by the following equation:

$$\text{Equation (1) Resistance } (\Omega)=R_S\times L/W$$

where $R_S$ is the sheet resistivity of the ink composition in ohms/square (Ω/□), L is the electrical length of the resistor, and W is the electrical width of the resistor. This relationship is conventionally used to design thick film resistors for hybrid circuits, with the length (L) of the resistor often being the final design characteristic manipulated to obtain the targeted resistance for a resistor in a circuit.

In practice, the behavior defined by Equation (1) above is non-ideal, with as-fired thick film resistors having lower resistances than that predicted by the ideal Equation (1). Generally, the sheet resistivity value of a resistor decreases as the length of the resistor decreases due to metal ion (conductor) diffusion into the resistor during firing, such as when silver-bearing thick film conductors are employed to terminate the resistor on the circuit. Changes in the TCR value of a resistor also occur, in that TCR values are a function of sheet resistance. The degree of conductor diffusion is relatively constant for a particular resistor ink-conductor ink combination. For very long resistors, the degree of diffusion may represent an insignificant portion of the resistor area, such that the effect on sheet resistivity may not be significant. However, for relatively short resistors, the same degree of diffusion represents a greater proportion of the resistor area, such that the effect of conductor diffusion on sheet resistivity can be significant, yielding an "out of balance" resistor whose resistance is below that required by its hybrid electronic circuit. Consequently, the above ideal Equation (1) cannot be used to accurately determine the resistance value of an as-fired thick film resistor, because the sheet resistance value of a given ink composition will change as a result of diffusion during firing.

As a result, thick film resistors must typically be trimmed to effectively increase their electrical length, and thereby increase their resistance values to that required by their circuits. While final resistance values of about ±1% can be achieved using abrasive or laser trimming techniques, the added processing step is undesirable from the standpoint of production costs and throughput, as well as reliability and stability of the resulting resistor. Generally, the degree to which the resistance value of a resistor can be corrected by trimming is limited by reliability considerations, such that values outside a specified range may result in its circuit being scrapped. Consequently, the ability to reduce or eliminate the requirement for trimming would enhance the reliability of the circuit and promote higher production rates.

Because trimming effectively increases the length of a resistor but does not change the sheet resistivity of the resistor composition, the TCR value of a resistor remains unchanged by the trimming process. Consequently, the TCR values of thick film resistors formed of the same ink can vary significantly from each other, particularly if the resistors have different aspect ratios (the length/width ratio of a resistor). Differences in TCR values between two or more resistors in a circuit are referred to as "TCR tracking." Many hybrid circuits require specific TCR tracking in order to perform appropriately under extreme thermal conditions. The degree of success in producing such circuits is therefore a function of the lengths of the resistors as a result of the tendency for conductor diffusion and its effect on the sheet resistivity and TCR value of a resistor.

In view of the above complications, current methodologies employed in the prior art to design thick film resistors include creating designs based on the ideal Equation (1), and then employing trial and error iterations to balance the resistors relative to the resistance values and TCR tracking required by a circuit. However, such an approach may take many iterations that can span several years. This is due largely to the nature of the trial and error balancing method, which does not enable any apparent imbalance to be identified as one that is specifically driven by the non-ideal behavior of the Equation (1) relationships or by variables of the printing and firing processes. Consequently, design iterations in which the dimensions of a resistor are adjusted in order to achieve a required resistor balance and/or TCR tracking are made unnecessarily if the true culprit is printer setup or temperature uniformity within the sintering furnace. As a result, as subsequent circuits are produced, slight differences in printer setup and/or firing parameters may necessitate yet another iteration to re-attain the required resistor balance and/or TCR tracking.

Another technique that can be used in conjunction with the iterate method described above is to reduce the degree of conductor diffusion into the resistor during sintering. Such a technique may involve the adding of diffusion blockers to the resistor ink composition, and/or employing thick film conductor inks that exhibit a low diffusion potential relative to the thick film resistor material. As such, this technique is intended to minimize the effect that conductor diffusion has on the resistivity and TCR value of a resistor. While such a solution may lessen the otherwise intense iterative method described above, current production ink compositions have not been effective enough to eliminate the requirement for post-firing trimming or achieve a desired level of TCR tracking.

From the above, it can be seen that present practices involving the processing of thick film resistors are generally inexact in terms of producing resistors which can be accurately and repeatably processed to exhibit resistance values and TCR tracking required by their hybrid electronic circuits. In particular, present practices generally necessitate numerous design iterations and time-consuming in-process trimming operations in order to attain the resistance and TCR values required by a circuit. Furthermore, prior art methods do not enable resistance values and TCR tracking targets to be readily achieved by thick film resistors in their as-fired condition. Accordingly, what is needed is a method for producing thick film resistors, in which the dimensions of an as-fired resistor can be accurately specified in the design stage so as to more readily achieve resistance values and balance between resistors of a circuit, even where such resistors have significantly different aspect ratios. It would also be desirable that such a method enable the production of resistors from a single ink to have near-constant TCR values, regardless of the physical sizes of the resistors, so as to improve TCR tracking.

SUMMARY OF THE INVENTION

It is an object of this invention to provide a thick film resistor configuration that can be fabricated in a manner that enables the required electrical characteristics of a thick film resistor to be substantially achieved in the as-fired condition, and therefore significantly minimize or eliminate the prior art requirement for post-firing trim operations.

It is another object of this invention to provide a method for fabricating thick film resistors having such a configuration.

It is still another object of this invention that such a resistor configuration and method do not require the use of additives in a thick film resistor or conductor ink from which a thick film resistor or conductor is formed, for the purpose of reducing the tendency of conductor diffusion into a thick film resistor during firing.

It is a further object of this invention that such a method enables thick film resistors to be produced from the same ink composition but with significantly different aspect ratios, yet exhibit minimal differences between TCR values so as to improve TCR tracking.

It is yet a further object of this invention that such a method enables a high throughput process for manufacturing high-reliability thick film resistors.

In accordance with a preferred embodiment of this invention, these and other objects and advantages are accomplished as follows.

According to the present invention, there is provided a novel thick film resistor configuration and a method for fabricating thick film resistors, by which such resistors can be processed to achieve targeted electrical properties in an as-fired condition. More particularly, the configuration and method of this invention involve creating a thick film resistor in the form of a series of short resistors whose combined resistance values approximately equal the predetermined resistance value required of the thick film resistor by its hybrid electronic circuit, yet with the use of minimal post-firing trimming. Such a configuration and method enable the production of thick film resistors from the same ink composition but with significantly different aspect ratios, yet which exhibit minimal differences between TCR values. Consequently, thick film resistors configured and fabricated in accordance with this invention are characterized by enhanced production throughput, repeatability, and reliability.

Generally, a thick film resistor configured in accordance with this invention includes a resistive portion formed from an electrically resistive material, and at least one conductive portion disposed in the resistive portion. The conductive portion extends at least partially across the width of the resistive portion so as to delineate resistor segments in the resistive portion and along its length. Preferably, the conductive portion or portions are equally spaced along the length of the resistive portion, such that the resistor segments have approximately equal lengths. In addition, the conductive portions preferably extend across at least about 40 percent of the width of the resistive portion.

According to this invention, because resistor segments formed in a thick film resistor as described above are of substantially equal lengths, conductor diffusion into the segments will be substantially uniform. As a result, the segments will be characterized by substantially equal resistivities, and therefore substantially equal resistance and TCR values when the thick film resistor is in an as-fired condition. Consequently, the total resistance of a thick film resistor configured in accordance with this invention can be readily and accurately predicted once it is determined what effect a given thick film conductor material has on the sheet resistivity of a given thick film resistor ink. Specifically, the resulting resistance value of the thick film resistor can be calculated by adding the individual resistance values of the resistor segments, according to the following equation:

$$\text{Equation (2): Resistance } (\Omega)=(R_S/W)_1+ \ldots (R_S/W)_n$$

where $R_S$ is the sheet resistivity of the as-fired resistor in ohms/square ($\Omega/\square$), W is the electrical width of the resistor, and n is the number of resistor segments based on a standardized electrical length (L). Therefore, by determining the effect that conductor diffusion will have on a resistor segment of the standardized length, the resistivity of substantially all resistor segments formed from a given resistive material and used with a given thick film conductor material will be constant and known, enabling the resistance of a thick film resistor formed from such materials and configured in accordance with this invention to be accurately predicted prior to firing by simply multiplying the resistance of each resistor segment by the number of segments used:

Equation (3): Resistance (Ω)=n($R_S$/W)

From the above, it can be appreciated that a significant advantage of this invention is that a hybrid electronic circuit having two or more thick film resistors formed from the same ink composition to have different aspect ratios (i.e., different widths and lengths), and each being configured to include resistor segments delineated by conductive portions in accordance with this invention, will have readily predictable resistance values in the as-fired condition. Another advantage of this invention is that such thick film resistors will also have essentially the same TCR value, thereby achieving a desirable level of TCR tracking for the circuit.

A significant aspect of the above is that thick film resistors of a hybrid electronic circuit can be readily balanced during the design stage to attain the resistances required by the circuit, and will exhibit similar temperature-related electrical properties during the operation of the circuit. Such a capability is in contrast to prior art methods that rely on design modifications made during processing of the resistors, such as trimming operations and design iterations. In some circumstances, thick film resistors can be fabricated without a trimming operation, while under worst-case scenarios a drastically reduced amount of trimming will be necessary to bring the resistor within the tolerance range permitted by the circuit.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
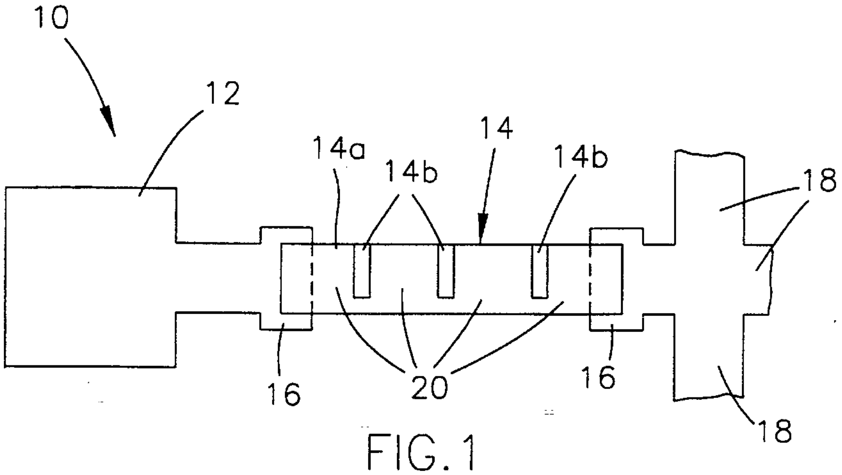
FIG. 1 shows a portion of a hybrid electronic circuit that includes a thick film resistor processed and configured in accordance with a preferred embodiment of the present invention.

FIG. 1 represents a portion of a hybrid electronic circuit 10 having a thick film resistor 14 configured and processed in accordance with this invention. As shown, the circuit 10 has a thick film conductor 12 that includes a pair of oppositely-disposed pads 16 between which the resistor 14 of this invention extends. Thick film runners 18 are shown as extending from one of the pads 16, so as to interconnect the resistor 14 to the remainder of the circuit 10. While a particular configuration for the conductor 12, resistor 14, pads 16 and runners 18 are shown, those skilled in the art will appreciate that numerous variations and modifications to the layout shown in FIG. 1 are possible, and such variations and modifications are within the scope of this invention.

The thick film resistor 14 shown in FIG. 1 is uniquely configured to achieve the objects of this invention, including a highly predictable resistance in the as-fired condition, as well as a TCR value that is essentially the same as other similarly-configured thick film resistors formed from the same material on the circuit 10. Consequently, post-firing trimming of the resistor 14 can be potentially eliminated, while TCR tracking of the circuit 10 is enhanced.

As shown, the resistor 14 of this invention is composed of a resistive portion **14*a* delineated by three conductive bars 14*b* to form distinct resistor segments 20 along the length of the resistor 14. The resistive portion 14*a* is formed from a thick film resistor composition, while the bars 14*b* are formed from an electrically conductive composition, both of which can be of types known in the art. For example, the composition used to form the resistive portion 14*a* may be one of several ruthenium-based resistor ink compositions available from DuPont Electronic Materials, while the conductive bars 14*b* can be formed from a suitable silver-bearing thick film conductor composition, though other materials could be foreseeably used. Preferably, the thick film conductor 12 and the bars 14*b* are formed from the same material so as to facilitate the process by which these features are formed, and such that the tendency for their constituents to diffuse into the resistive portion 14*a* will be approximately equivalent. As is conventional in the art, the material selected for the resistive portion will be based in part on the resistance value required by the circuit 10**, and formulated to have an appropriate sheet resistivity $R_S$, typically a decade value from about 1 Ω/□ to about 10 MΩ/□, (per 25 micrometers of dried thickness), or a blend of ink compositions to produce an intermediate resistivity.

The conductive bars **14*b* shown in FIG. 1 extend across approximately 75 percent of the width of the resistive portion 14*a*, and are equally spaced along the length of the resistive portion 14*a* such that the resistor segments 20 have approximately equal lengths. The bars 14*b* could be formed to have widths and lengths other than that shown in FIG. 1, and to extend from opposite sides or alternating sides of the resistor 14, the latter arrangement serving to facilitate "serpentine" laser trimming techniques. The bars 14*b* can also be formed to extend across the entire width of the resistive portion 14*a*, while a preferred minimum length for the bars 14*b* is roughly about 40 percent of the width of the resistive portion 14*a*. The configuration shown in FIG. 1, in which the bars 14*b* extend across only a fraction of the width of the resistive portion 14*a*, is generally preferred in order to permit trimming during the assembly or component attach process to match a particular thick film resistor to a single or set of discrete components, so as to tune the circuit when signal is applied. The remaining 25 percent of the width of the resistive portion 14*a* permits a well controlled, highly stable trim cut to be made along the length of the resistor 14** for fine adjustment.

Figure 2:
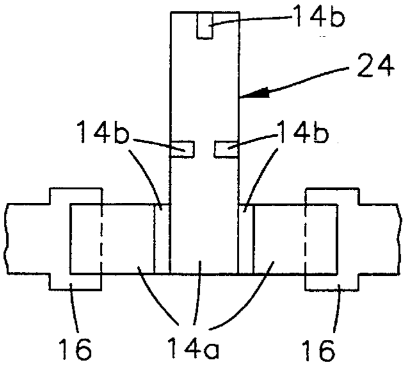
FIG. 2 shows a "top hat" thick film resistor that has been processed and configured in accordance with a preferred embodiment of the present invention.

Notably, the present invention can also be practiced with resistor configurations commonly referred to in the art as "top hat" resistors, an example of which is shown in FIG. 2 and identified by the reference number 24. According to this invention, top hat resistors provide the same capability for fine adjustment as the resistor 14 of FIG. 1 if a greater degree of trimming is required. As shown, the lengths of the conductor bars 14*b* can vary, depending on the location of the bars 14*b* within the resistive portion 14*a* of the resistor 24.

Because the resistor segments 20 that form the thick film resistors 14 and 24 are of substantially equal lengths, the diffusion of metal ions from the thick film conductor 12 and the bars 14*b* into the segments 20 is substantially uniform among the segments 20. As a result, the segments 20 are characterized by substantially equal sheet resistivities, and therefore substantially equal resistance values due to their approximately equal lengths. Furthermore, because the segments 20 have substantially equal resistivities, their TCR values are also approximately equal. Consequently, the total resistance of the thick film resistors 14 and 24 can be readily and accurately predicted once it has been determined what effect the thick film conductor material or materials of the conductor 12 and bars 14*b* have on the sheet resistivity of the particular thick film resistor material. Specifically, the final resistivity of the particular thick film resistor material based on a standardized length for all segments 20 can be determined, thereby enabling the resulting resistance value of the thick film resistor to be calculated by adding the individual resistance values of the resistor segments 20, according to Equation (3):

$$\text{Resistance}=n(R_S/W)$$

where $R_S$ is the sheet resistivity of each of the resistor segments 20 as determined by the length of the segments 20 and the effect of conductor diffusion into the segments 20, W is the electrical width of the resistor segments 20, and n is the number of resistor segments 20 that form the resistor—four in the example shown in FIG. 1.

From this scenario, it is apparent that the resistance values will be known and essentially the same for all resistor segments 20 formed from a particular resistive material and used with a particular conductive material used to form the conductor 12 and bars 14*b*. As a result, the resistance value for any thick film resistor formed from these materials and having resistor segments 20 with the standardized length can be accurately predicted prior to firing by simply multiplying the resistance of each resistor segment 20 by the number of segments 20 used. Ideally, a segment length adopted as the standardized length should be based on the minimum length for thick film resistors intended to be fabricated. In the electronics industry, about one millimeter (about 0.040 inch) is typically the minimum length for thick film resistors, and therefore would be suitable for adopting as a standardized length in the practice of this invention, though significantly different lengths could be foreseeably adopted.

A suitable process for fabricating a thick film resistor such as that shown in FIG. 1 is generally as follows. As noted above, the thick film materials for the resistive portion 14*a*, the conductor 12 and the conductive bars 14*b* may be chosen from those commercially available. Notably, because the present invention does not seek to preclude conductor diffusion into the resistor 14, it is unnecessary to use specially formulated thick film compositions intended to reduce the diffusion of metal ions into the resistive portion 14*a* of the resistor 14, of which current generation commercial thick film resistor compositions are examples. Instead, the present invention harnesses the effect of conductor diffusion to achieve a uniform or balanced resistance distribution regardless of the aspect ratios of the resistors required by the circuit 10, and to maintain a near-constant TCR value for resistors fabricated from the same resistor ink composition.

Prior to printing, the physical dimensions of the resistor 14 are to be defined based on often predetermined criteria, such as the resistance value and length of the resistor 14, from which the number of conductor bars 14*b* and the width of the resistor 14 can be calculated. As is conventional, the resistance value of each thick film resistor 14 required by the circuit 10 will generally dictate the use of a particular resistor ink composition to provide a suitable initial sheet resistivity. Based on this information, an aspect ratio (length/width) can be calculated to approximate the desired resistance value for the resistor 14 by dividing this resistance value by the initial sheet resistivity of the particular thick film resistor ink composition. In accordance with this invention, the length of the resistor 14 can be based on the specific design and space constraints of the circuit 10. The number of segments 20 required to form the resistor 14 can then be determined by dividing the required length of the resistor 14 by the standardized length chosen for the segments 20, e.g., about one millimeter. The number of bars 14*b* required to delineate the segments 20 is calculated by subtracting "1" from the number of segments 20 required.

The next step in designing the resistor 14 of this invention is to determine a sheet resistance factor based on statistical data that indicates the particular degree of conductor diffusion that occurs with the particular conductor and resistor materials being used. This factor will reflect that the initial sheet resistivity of the resistor ink composition will be reduced by the effect of conductor diffusion, and can be derived statistically through testing segments 20 formed from the particular resistor ink composition to have the standardized length, and terminated with conductors formed from the particular conductor ink composition. Finally, the width of the resistor 14 can be calculated by dividing the required length of the resistor 14 by the aspect ratio previously calculated, with this result being modified by the sheet resistivity factor. In effect, the width of the resistor 14 is the dimension modified to compensate for the effect of conductor diffusion into the resistive portions 14*a*, in contrast to the prior art technique of altering the length of a thick film resistor.

While the above is a preferred order for designing and processing thick film resistors in accordance with this invention, it is foreseeable that the order of design could be altered from that described.

Any suitable printing process can be employed to deposit the thick film materials used in the process of this invention, such as a screen printing technique. The series of resistor segments 20, the bars 14*b* and the conductor 12 are created by printing the thick film materials, such that the bars 14*b* will be within the body of the resistive portion 14*a*. As in the example described above, a preferred length for the resistor segments 20 is about one millimeter, though it is foreseeable that lesser or greater lengths could be used. Consequently, the spacing between adjacent bars 14*b* and between the outermost bars 14*b* and the pads 16 would be about one millimeter between centers. A suitable width for the bars 14*b* is about 0.25 millimeters (about 0.010 inch), though other widths could be foreseeably used. Generally, wider bars 14*b* unnecessarily take up space and provide no improvement in performance, while thinner bars 14*b* are possible if permitted by the particular printing process used to deposit the thick film materials. After printing, the thick film inks are dried and then sintered to convert the inks into suitable thick films that adhere to the circuit's substrate. During sintering, the inks are heated at a rate that is sufficiently slow to promote stability of the resistor 14 and to allow the organic vehicles of the inks to burn off.

FIGS. 3 through 7 reflect data generated through the fabrication and testing of thick film resistors of the type shown in FIGS. 1 and 2. FIGS. 3 through 6 represent TCR tracking as a function of aspect ratio (length/width) using thick film resistor materials of approximately 100 Ω/□ and 10K Ω/□ printed to achieve the aspect ratios indicated. Firing of the materials was performed with an infrared furnace at a peak temperature of about 895° C. to about 915° C. Specimens corresponding to this invention were configured with conductor bars **14*b* spaced about one millimeter apart on centers, while other specimens were configured without conductor bars 14*b* in accordance with prior art thick film resistor designs. Each set of specimens was then tested as-fired for hot and cold TCR tracking at temperatures of about 125° C. and about −55° C., respectively. The conductor material used to form the bars 14*b* and the conductors 12** terminating the resistors was a silver-based material identified as 7484 and available from DuPont. This material was selected due to the known tendency for silver ions to diffuse into a thick film resistor during sintering.

Figure 3:
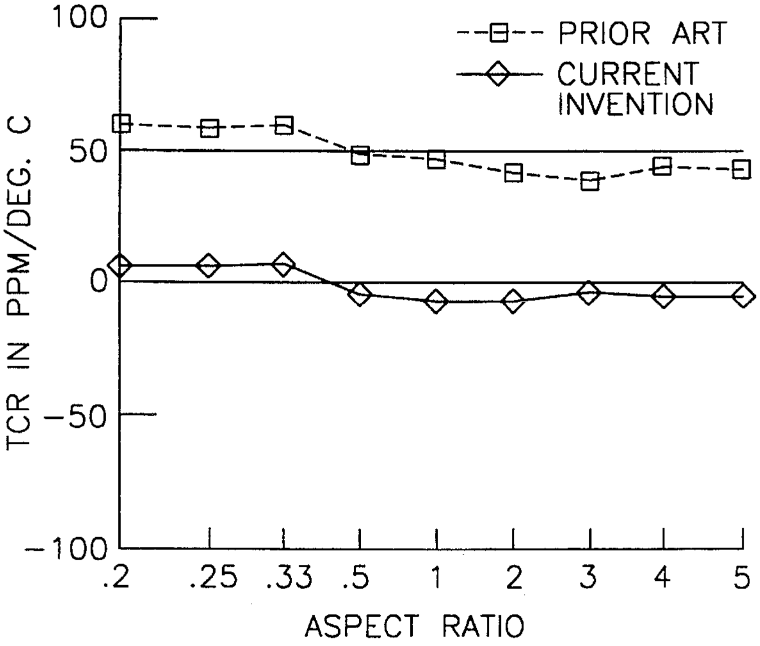
FIGS. 3 through 6 represent near-constant temperature coefficient of resistance (TCR) values of resistors processed and configured in accordance with the present invention, and contrasted to resistors processed and configured in accordance with the prior art.
Figure 4:
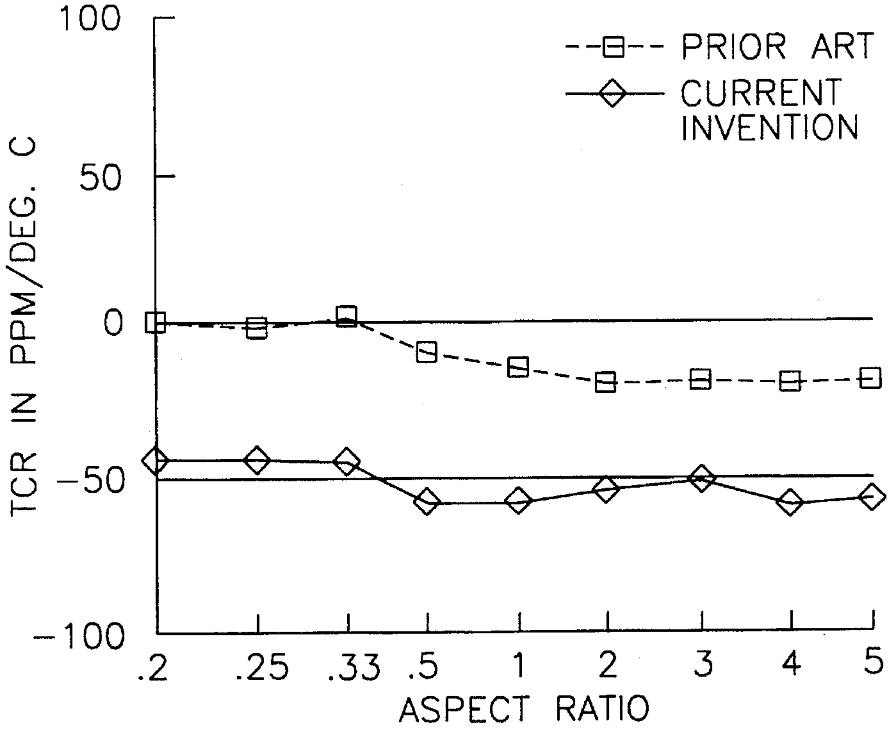
Figure 5:
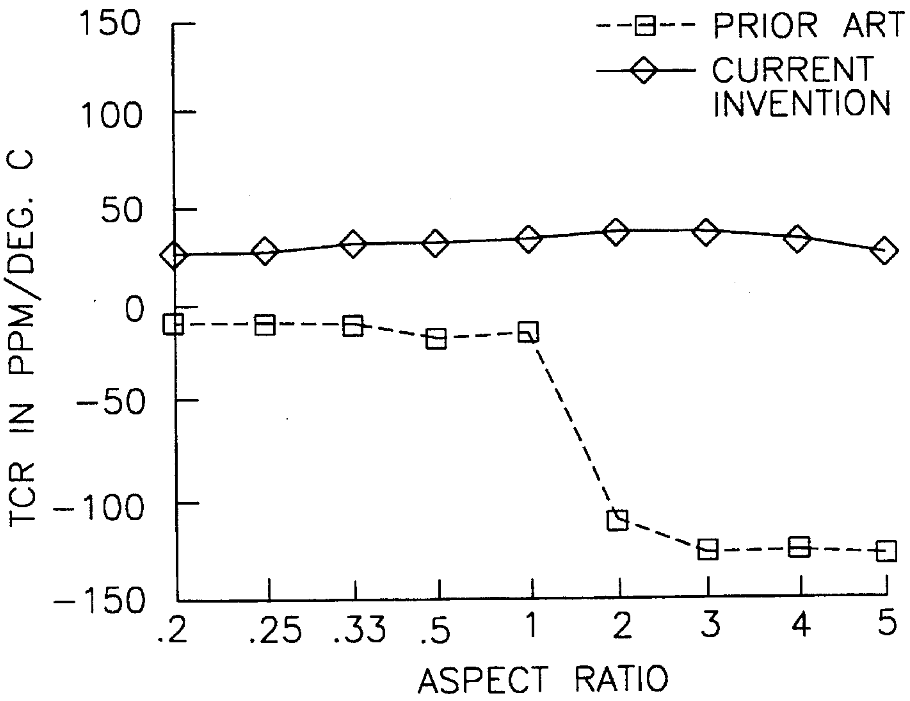
Figure 6:
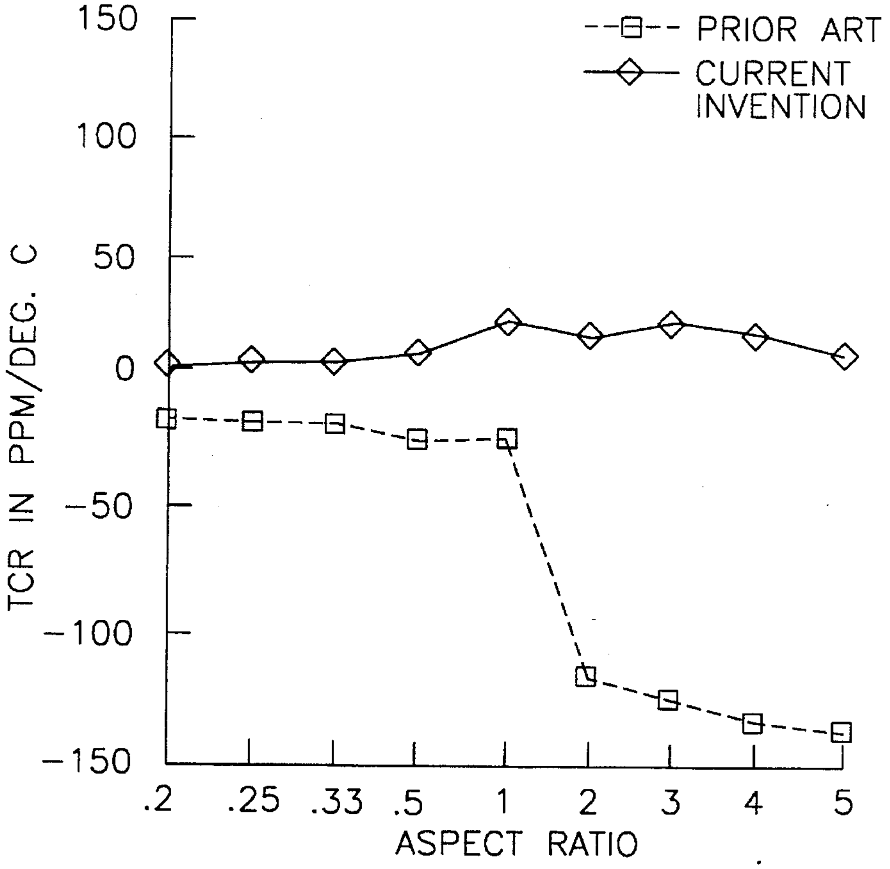

The results of the hot and cold tests of the 100 Ω/□ material are represented in FIGS. 3 and 4, respectively, and results of the hot and cold tests of the 10K Ω/□ material are represented in FIGS. 5 and 6, respectively. From these results, it is apparent that both hot and cold TCR tracking of the prior art specimens was not flat because of significant changes in TCR values, particularly for the 10K Ω/□ material for aspect ratios of greater than 1. In contrast, the specimens configured in accordance with this invention exhibited near-constant TCR tracking, characterized by substantially equal TCR values over the entire range of aspect ratios tested, with deviations of less than about 20 ppm/°C., and often 10 ppm/°C. or less, being exhibited. Such results indicate that the adverse effect of silver ion diffusion into the resistor materials was normalized over a wide range of aspect ratios by the presence of resistor segments having a standardized length, as represented by the resistors 14 and 24 of FIGS. 1 and 2.

Figure 7:
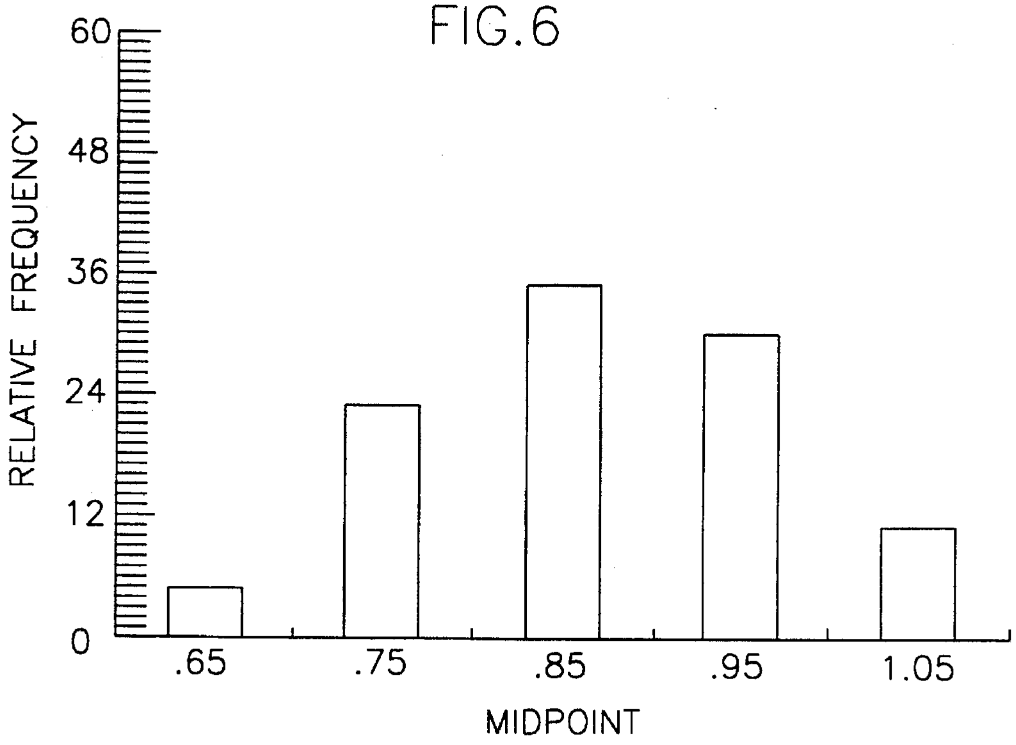
FIG. 7 represents a resistance distribution for resistors fabricated in accordance with this invention from different compositions and configured to have a wide range of aspect ratios.

FIG. 7 represents the resistance value distribution of 240 resistors formed in accordance with this invention. The resistors were formed using the same resistor materials noted above to have various lengths and widths, with aspect ratios of between about 0.1 and about 6.7. As before, conductor bars were spaced about one millimeter apart on centers. These resistors were then tested as-fired to determine their resistance values. The results of this test depicted in FIG. 7 indicate an extremely tight distribution of resistance values of about ±20 percent around an average resistance equal to about 85 percent of the target for the entire distribution of 240 resistors. Such results demonstrate that a thick film resistor can be readily fabricated in accordance with this invention to attain a resistance value of within about 20 percent of a predetermined resistance target in the as-fired condition, and therefore without requiring significant trimming after firing. Because post-firing trim operations can be eliminated or the degree of trimming can be at least significantly reduced by the process of this invention, the resulting thick film resistors are capable of exhibiting greater reliability and stability under adverse environmental conditions and higher processing throughput as compared to trimmed thick film resistors of the prior art.

Figure 8:
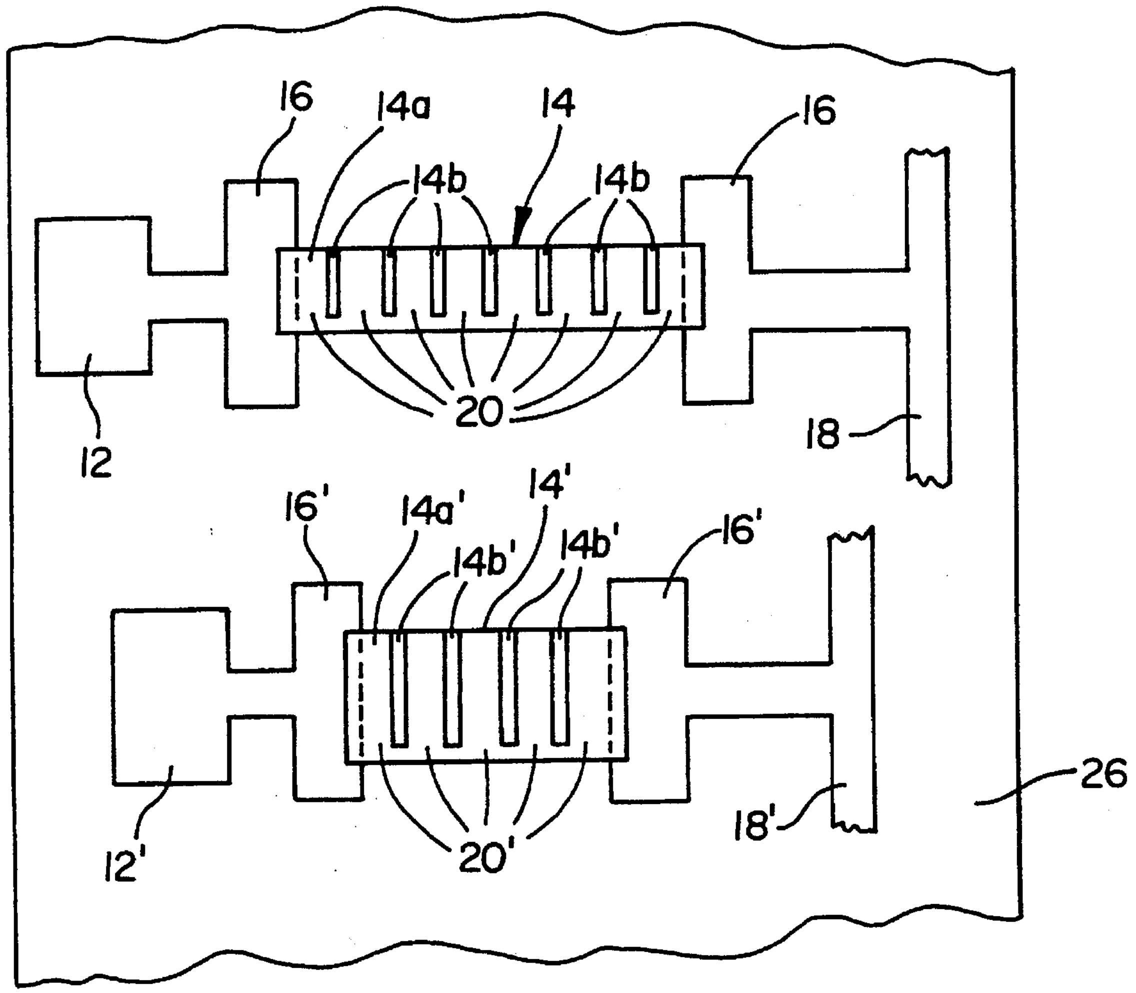
FIG. 8 depicts an electronic circuit board having two resistors formed in accordance with this invention, but having significantly different aspect ratios.

From the above, it can be appreciated that a significant advantage of this invention is that an electronic circuit board having thick film resistors configured in accordance with this invention and formed from the same ink composition but with significantly different aspect ratios will have readily predictable resistance values and near-constant TCR values in the as-fired condition. An example of such an arrangement is depicted in FIG. 8, where two resistors 14, 14' having significantly different aspect ratios are formed on a common circuit board 26. The various reference numerals correspond to those used in FIG. 1, unprimed for the resistor depicted in the upper portion of the figure, and primed for the resistor depicted in the lower portion of the figure. Another advantage of this invention is that thick film resistors formed from different ink compositions will also exhibit near-constant TCR values, though conductor diffusion tendencies may differ among the various ink compositions used. A significant aspect of the above is that thick film resistors can be readily balanced to attain the resistances required by the circuit, and will exhibit similar temperature-related electrical properties during the operation of the circuit, through the use of procedures undertaken during the design stage, as opposed to modifications made in-process. In some circumstances, thick film resistors can be fabricated without requiring a post-firing trimming operation, while a drastically reduced amount of trimming may be necessary to bring a resistor within the tolerance range permitted by a circuit under a worst-case scenario. Finally, the present invention provides a novel thick film resistor configuration and a method for fabricating thick film resistors characterized by enhanced production throughput, repeatability, and reliability. Notable, the above is achieved without the use of additives used in the prior art to reduce the degree of conductor diffusion into the resistor composition. As such, this invention permits the use of potentially less costly compositions and processing techniques.

While our invention has been described in terms of a preferred embodiment, it is apparent that other forms could be adopted by one skilled in the art. For example, different materials and resistor configurations could be used other than those noted and shown, and processing techniques and processing orders other than those noted could be employed. Accordingly, the scope of our invention is to be limited only by the following claims.

The embodiments of the invention in which an exclusive property or privilege is claimed are defined as follows:

1. A thick film resistor comprising:

a resistive portion characterized by a length and a width, the resistive portion being formed of an electrically resistive material; and at least one conductive portion disposed in the resistive portion and extending across only a portion of the width of the resistive portion so as to delineate resistor segments in the resistive portion along the length of the resistive portion.

2. Thick film resistor apparatus comprising:

a first thick film resistor on an electronic circuit board, including a resistive portion characterized by a length and a width, the resistive portion being formed of an electrically resistive material at least one conductive portion disposed in the resistive portion of said first thick film resistor and extending at least partially across the width of such resistive portion so as to delineate resistor segments in such resistive portion along the length of such resistive portion;

a second thick film resistor on said electronic circuit board including a resistive portion characterized by a length and a width that differ from the length and width of the resistive portion of the first thick film resistor, the resistive portion of the second thick film resistor being formed of the electrically resistive material of the first thick film resistor; and at least one conductive portion disposed in the resistive portion of the second thick film resistor and extending at least partially across the width of the resistive portion of the second thick film resistor so as to delineate resistor segments along the length of the resistive portion of the second thick film resistor;

wherein the resistor segments of the first and second thick film resistors are characterized by substantially equal TCR values.

3. A thick film resistor comprising:

a resistive portion characterized by a length and a width, the resistive portion being formed of an electrically resistive material; and at least one conductive portion disposed in the resistive portion and extending at least partially across the width of the resistive portion so as to delineate resistor segments in the resistive portion along the length of the resistive portion, said conductive portion including a metal or metal alloy that diffuses into the electrically resistive material of the resistive portion, such that the electrical resistance of the resistive portion is less than the electrical resistance of the electrically resistive material.

4. A hybrid electronic circuit having as-fired thick film resistors, comprising:

a first thick film resistor including a resistive portion characterized by a length and a width, the resistive portion being formed of an electrically resistive material;

at least one conductive portion disposed in the resistive portion of said first thick film resistor and extending across only a portion of the width of the resistive portion, the at least one conductive portion being spaced along the length of the resistive portion by approximately equal distances so as to delineate resistor segments of approximately equal lengths along the length of the resistive portion;

a second thick film resistor including a resistive portion characterized by a length and a width differing from the length and width of the resistive portion of the first thick film resistor; and at least one conductive portion disposed in the resistive portion of the second thick film resistor and extending across only a portion of the width of the resistive portion of the second thick film resistor, such at least one conductive portion being spaced along the length of the resistive portion of the second thick film resistor by approximately equal distances so as to delineate resistor segments of approximately equal lengths along the length of the resistive portion of the second thick film resistor;

the resistive portions of the first and second thick film resistors being formed of substantially the same electrically resistive material, the first and second thick film resistors having substantially equal TCR values.

5. A hybrid electronic circuit having as-fired thick film resistors, each of the thick film resistors comprising:

a resistive portion characterized by a length and a width, the resistive portion being formed of an electrically resistive material; and at least one conductive portion disposed in the resistive portion and extending across only a portion of the width of the resistive portion, the at least one conductive portion being spaced along the length of the resistive portion by approximately equal distances so as to delineate resistor segments of approximately equal lengths along the length of the resistive portion, said conductive portion including a metal or metal alloy that diffuses into the electrically resistive material of the resistive portion, such that the electrical resistance of the resistive portion is less than the electrical resistance of the electrically resistive material.

* * * * *